(12) United States Patent
Tsujino

(10) Patent No.: US 6,665,225 B2
(45) Date of Patent: Dec. 16, 2003

(54) SEMICONDUCTOR INTEGRATED CIRCUIT WITH REDUCTION OF SELF REFRESH CURRENT

(75) Inventor: Mitsunori Tsujino, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/158,944

(22) Filed: Jun. 3, 2002

(65) Prior Publication Data

US 2003/0103403 A1 Jun. 5, 2003

(30) Foreign Application Priority Data

Dec. 3, 2001 (JP) ......................................... 2001-368739

(51) Int. Cl.⁷ ................................................ G11C 7/00
(52) U.S. Cl. ..................................... 365/222; 365/229
(58) Field of Search ................................ 365/222, 226, 365/189.09, 229, 230.06, 243

(56) References Cited

U.S. PATENT DOCUMENTS

| | | | | | |
|---|---|---|---|---|---|
| 5,602,784 A | * | 2/1997 | Kojima et al. | ......... | 365/189.09 |
| 6,335,893 B1 | * | 1/2002 | Tanaka et al. | ............... | 365/226 |
| 6,449,182 B1 | * | 9/2002 | Ooishi | .......................... | 365/63 |

* cited by examiner

Primary Examiner—Thong Le
(74) Attorney, Agent, or Firm—McDermott, Will & Emery

(57) ABSTRACT

In a semiconductor integrated circuit having a DRAM, a DWL driver circuit has a bias function unit (42, 43) for supplying, as a potential of a word line, a sub decode signal of an H level in an active state and an L level signal of a ground potential in a standby state, and switching the potential of the word line to a low potential for self refresh which is higher than the ground potential only by a very small value (+αvolts) in a self refresh mode. Thus, a refresh cycle is extended to thereby reduce a self refresh current.

12 Claims, 6 Drawing Sheets

CONVENTIONAL DRIVER CIRCUIT

SEMICONDUCTOR INTEGRATED CIRCUIT WITH REDUCTION OF SELF REFRESH CURRENT

BACKGROUND OF THE INVENTION

1. Field of the Invention

The present invention relates to a semiconductor integrated circuit and, more particularly, to a semiconductor integrated circuit with a self refresh current which is reduced by an improved refreshing characteristic in a self refresh mode in a volatile device such as a DRAM requiring a refreshing operation.

2. Description of the Prior Art

Generally, in a semiconductor memory module or the like in which a semiconductor chip including a DRAM is mounted, a chip select signal CS is generated for selectively operating the DRAM in accordance with an upper significant bit of an address signal supplied from a microprocessor (CPU), and a refresh command signal is generated for giving a refresh timing on the basis of control signals such as a chip enable signal CE, a read enable signal RE, a row address strobe signal RAS, and a column address signal CAS supplied from the microprocessor (CPU). These generated chip select and refresh command signals are supplied to each DRAM.

Each DRAM has a refresh control function of determining a refresh mode on the basis of the strobe signals, setting a word line to a selection level and performing a refresh operation. To realize such a self refresh function, a semiconductor integrated circuit including a DRAM as a nonvolatile device in a chip has an address generating circuit and a self timer for measuring a self refresh cycle.

A memory cell array in a DRAM chip is generally divided into a plurality of banks, and only a selected part of the banks is operated in a read/write operation. However, in a refreshing operation, usually, all of the banks are concurrently operated, and therefore a peak current becomes large. As a result, in a DRAM module as well, a large peak current flows in the refreshing operation. This causes a Vdd/GND noise (i.e., power source noise), which results in an erroneous operation.

In a DRAM and the like device, it is conventionally desired to reduce current consumption (Icc6 or the like) in the self refresh mode. As a method of reducing the current consumption (Icc6), generally, there is employed a method of increasing a cycle of a self timer. For example, in a process of refreshing a DRAM, there is employed a method of switching a clock to a low frequency clock in a standby mode to thereby make the refresh interval longer.

In this method, however, there is a limitation in extending the cycle of the self timer, so that this method is insufficient. Specifically, a range of extending the cycle of the self timer is limited by a retention time of cell data (i.e., refresh retention time), and therefore the cycle of the self timer cannot be sufficiently extended.

However, in future, the consumption current (Icc6) is increasing as the memory capacity increases and accordingly the process become finer. Therefore, in order to realize lower power consumption of a device as well, it is an important subject to reduce the current consumption (Icc6) in the self refresh mode.

FIG. 5 shows a block configuration of a conventional DWL driver circuit. The DWL driver circuit has a transistor MOS1 and a pair of opposing transistors MOS2 and MOS3. As a gate signal for performing an ON/OFF control on the transistors, a gate signal (ZMWL) is supplied to the gates of the transistors MOS1 and MOS2, and a gate signal (ZSDA) is supplied to the gate of the transistor MOS3. As a potential of a word line WL, a potential selected by the DWL driver circuit is applied. In an active state, an H-level potential of a sub decode signal SDA is supplied to the word line WL. In a standby state (non-active state), an L-level potential (=0 volt) of a ground potential GND is supplied.

In recent years, in studies regarding the cell data retention time (refresh cycle), as one of main factors of deteriorating the retention time of cell data, a GIDL (Gate Induced Drain Leakage) phenomenon is considered.

FIG. 6A shows a model for explaining occurrence of the GIDL, and FIG. 6B shows a bias condition at the time of the GIDL occurrence. Conventionally, in the self refresh mode, a device is operated in the same bias condition as that in the normal mode. In FIG. 6A, a bit line BL side corresponds to a source side, a word line WL side corresponds to a gate side, and a storage node SN/SC corresponds to a drain side.

The potential of the bit line BL is switched between H and L levels in accordance with whether the bit line BL is selected or not. The gate in the standby state is set to a ground (GND) potential (=0 volt) level of the DWL driver circuit, and the word line WL is set to the L level (0 volt). The example shown in FIG. 6B shows a failure mode in which an error of the level from H to L occurs in one bit cell.

When an electric field is generated between the gate side in the standby state and the drain side (on the side of storage node SN/SC) to which the H level of cell data (array Vdd level) is written, the electric field between the gate and drain becomes strong in the vicinity of a gate oxide film. Consequently, a distortion occurs between energy bands of the substrate and drain in the vicinity of a channel substrate surface, and electric potential levels Ev and Ec shown in FIG. 6B approach each other, and electrons (−) and positive holes (+) transit between the bands, and a current leak is caused. That is, it is considered that a tunnel leak between bands occurs. When such a current leak occurs, retention time of cell data deteriorates. Therefore, the range of extending the cycle of the self timer is limited.

SUMMARY OF THE INVENTION

The invention has been developed to solve the problem by paying attention to the fact that the current leak of the GIDL component can be controlled by, in consideration of an inter-band tunnel leak phenomenon which occurs between a gate and a drain, changing a potential of a word line WL to thereby change an electric field generating between the gate and the drain and control the distortion ratio of the bands.

The invention employs such a method of controlling the current leak of the GIDL component. By setting the potential of a word line WL in the standby state to a low voltage for self refresh which is higher than a normal ground (GND) potential (=0 volt) only by a very small value, the potential difference between the word line WL and the drain (SC) is reduced. Accordingly, an object of the invention is to provide a semiconductor integrated circuit with a reduced current leak of the GIDL component, an improved refresh cycle (retention time of cell data), and a reduced self refresh current.

To achieve the object, one aspect of the present invention provides a semiconductor integrated circuit having a DRAM mounted thereon, which includes: a DWL driver circuit for selectively driving a word line, supplying a sub decode signal of an H level as a potential of the word line in an active state, and supplying an L-level signal of a ground potential in a standby state for a normal operation; and bias means for switching and connecting in a self refresh mode the potential of the word line to a potential of a low voltage for self refresh which is slightly higher than the ground potential.

In another aspect of the present invention, the bias means includes a self refresh GND switching circuit interposed between the DWL driver circuit and the ground potential and further includes a low voltage generating circuit connected to the self refresh GND switching circuit, for generating a low voltage for self refresh which is higher than the ground potential only by a very small value. In the self refresh mode, the self refresh GND switching circuit disconnects the word line from the ground potential and biases the potential of the word line to the low voltage value for self refresh generated by the low voltage generating circuit in a standby state.

With the configuration according to the present invention, the potential difference between the word line and the drain can be decreased, and the current leak of the GIDL component can be reduced. That is, the refresh characteristic can be improved, and the cycle of the self timer can be extended. Thus, the current consumption in the self refresh mode can be reduced.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DETAILED DESCRIPTION OF THE PREFERRED EMBODIMENTS

Figure 1:
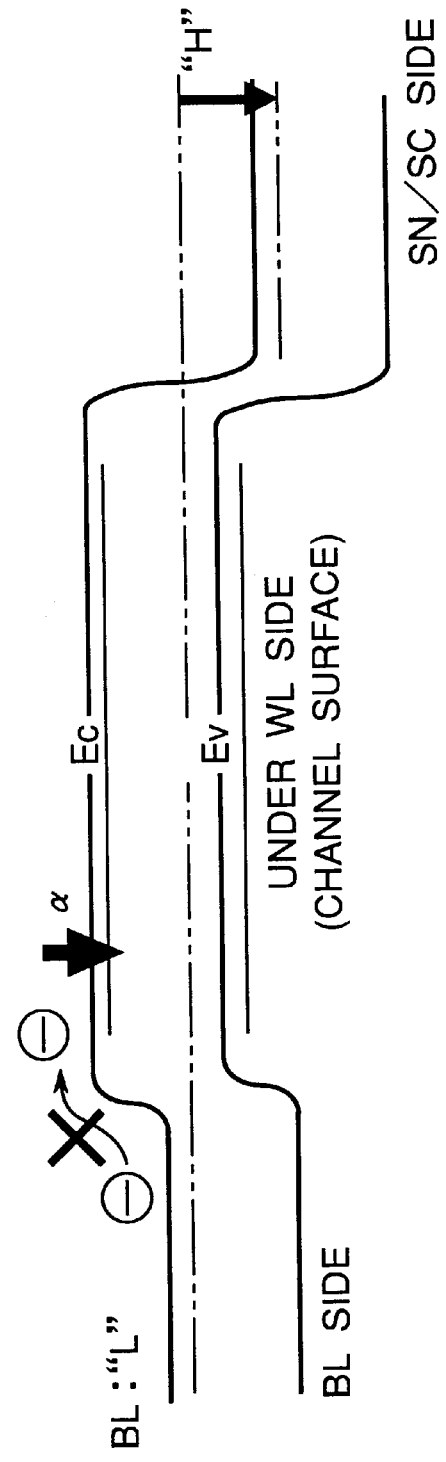
FIG. 1 is an explanatory diagram showing the upper limit of setting of a standby WL potential of the invention and a bias condition at that time.

Before the description proceeds, it is to be noted that, since the basic structures of the preferred embodiments are in common, like parts are designated by the same reference numerals throughout the accompanying drawings.

In consideration of the above-described interband tunnel leak phenomenon which occurs between gate and drain sides, preferred embodiments of the invention use a method of changing a potential of a word line WL in a standby state to change an electric field between the gate and the drain and change a distortion ratio of the bands, thereby controlling a current leak of a GIDL component.

As shown in FIG. 1, in an embodiment of the present invention, the potential of word line WL in a standby state in a self refresh mode is set to a low voltage value a slightly higher than the ground potential (0 volt), and the potential difference between the word line WL and the drain (SC) is reduced. In the following description, this low voltage value α will be called a "GND for self refresh" or "low potential for self refresh" so as to be distinguished from a ground potential GND of 0 volt in a normal operation.

By providing GND for self refresh ($=\alpha V$), occurrence of a strong electric field can be prevented in the vicinity of a gate oxide film even when an electric field is generated between a gate in a standby state and a drain (SC) in which a H level of cell data is written. Thus, approach between the electric potentials Ec and Ev is suppressed, a current leak of the GIDL component is prevented, and a refresh cycle (cell data retention time) is improved.

Specifically, as shown in FIG. 1, in the self refresh mode, the potential of the word line WL in the standby state is slightly increased from GND (0 volt) so as to be switched to (GND+α) volts. The upper limit of the low voltage value α for self refresh is set so as to be a value within the range of a level at which the L-level potential of bit line BL on the source side does not cause a channel leak to the drain side.

For the purpose, the invention is characterized by providing a low voltage generating circuit for generating the low voltage (α) for self refresh and a self refresh GND switching circuit for switching a word line WL to the GND for self refresh ($=\alpha V$) in the self refresh mode. The low voltage generating circuit and self refresh GND switching circuit will be described below with reference to FIGS. 2 to 4.

Embodiments of the invention will be described hereinbelow with reference to FIGS. 2 to 4. Components common to the drawings are designated by the same reference numerals and their description will not be repeated.

[First Embodiment]

Figure 2:
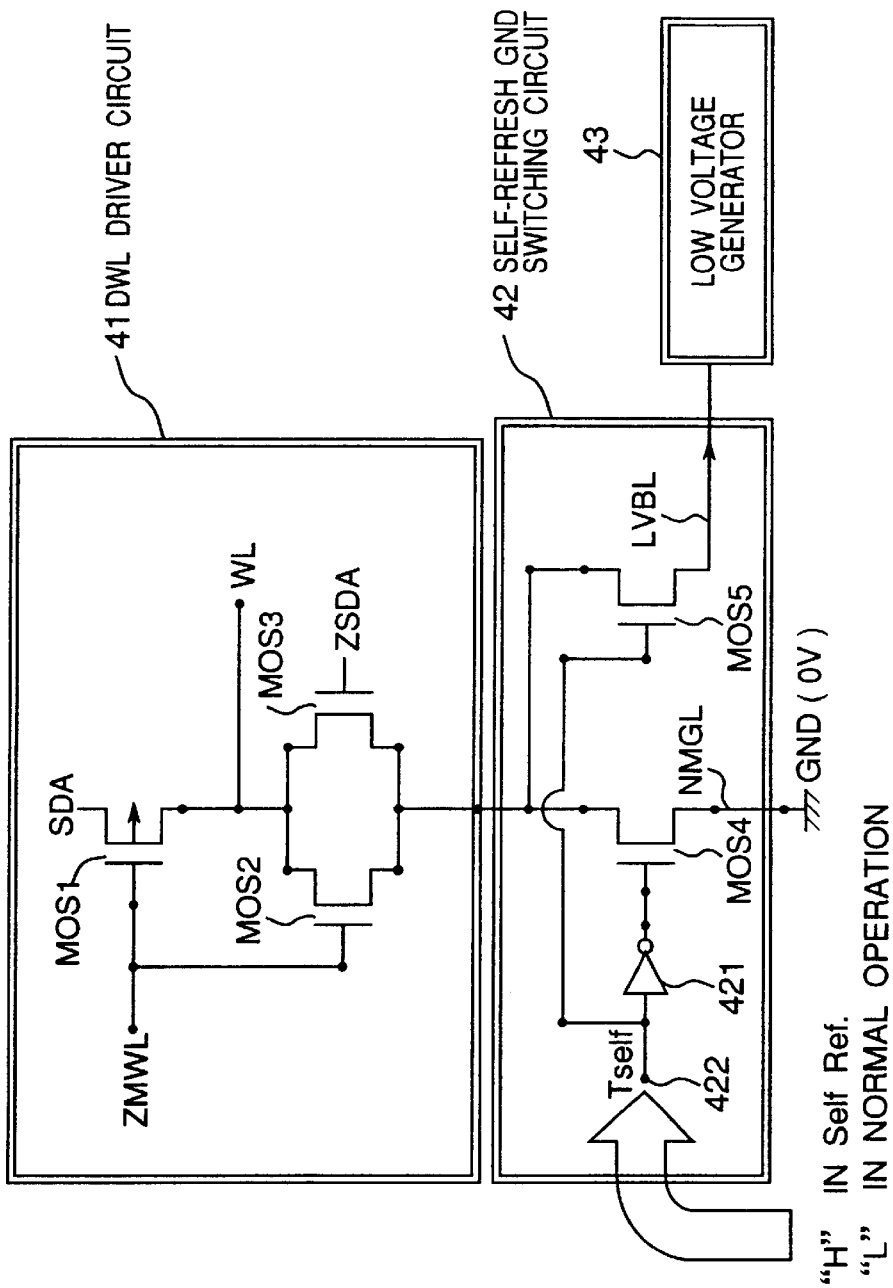
FIG. 2 is a block diagram showing a WL potential switching mechanism according to a first embodiment of the invention.
Figure 5:
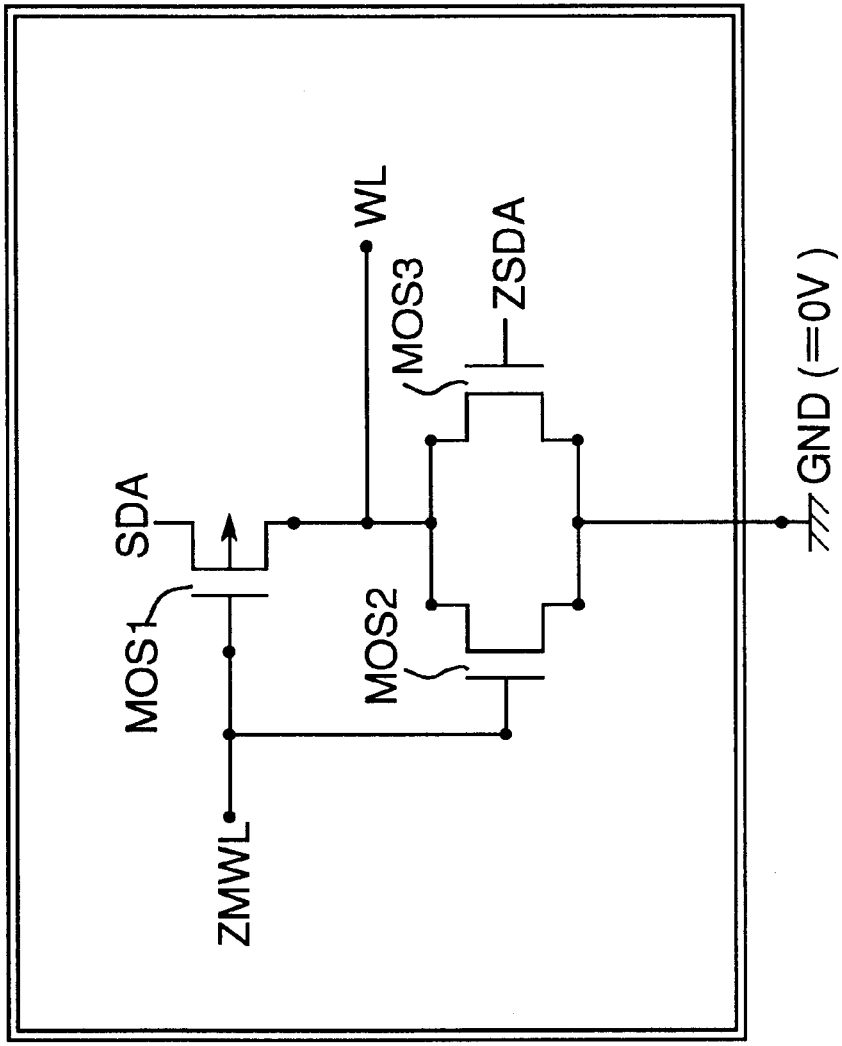
FIG. 5 is a block diagram showing the configuration of a conventional DWL driver circuit.
Figures 6A, 6B:
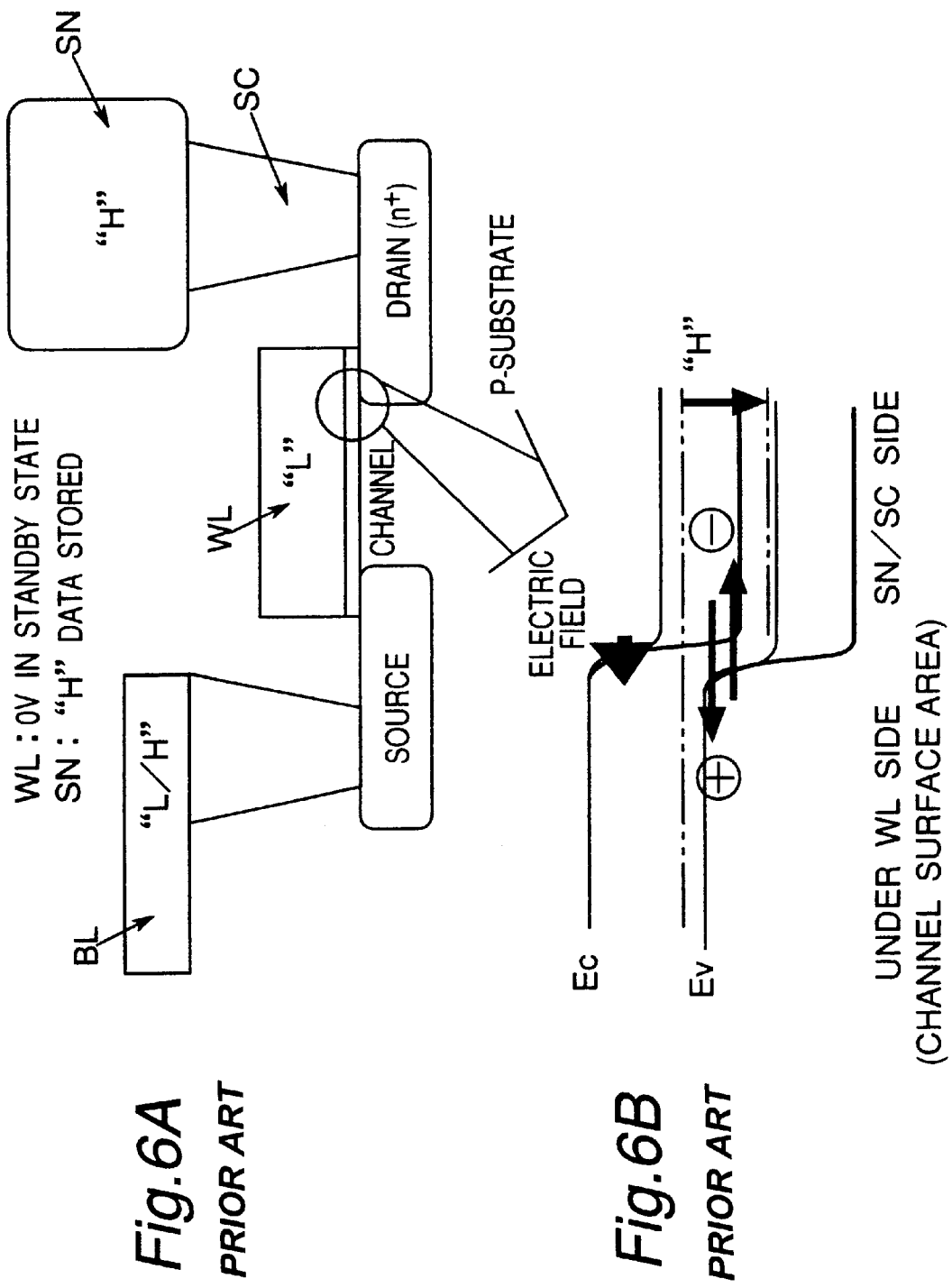
FIG. 6A is a diagram of a model showing occurrence of GIDL in a conventional technique.
FIG. 6B is an explanatory diagram showing the bias condition at that time.

FIG. 2 is a block diagram showing a WL potential switching mechanism according to a first embodiment of the invention. The first embodiment of the invention will be described with reference to FIG. 2. The configuration of a DWL driver circuit 41 shown in FIG. 2 is similar to that of the conventional DWL driver circuit shown in FIG. 5. The specific feature of the present embodiment resides in the fact that, in addition to the DWL driver circuit 41, a self refresh GND switching circuit 42 and a low voltage generating circuit 43 for supplying a low potential for self refresh are newly built in the DWL driver circuit 41.

As shown in FIG. 2, the DWL driver circuit 41 has a transistor MOS1 and a pair of transistors MOS2 and MOS3 opposing to each other. As gate signals for performing on/off control on the transistors, a gate signal (ZMWL) is supplied to the gates of the transistors MOS1 and MOS2, and a gate signal (ZSDA) is supplied to the gate of the transistor MOS3. As a potential of the word line WL, a potential selected by the DWL driver circuit is supplied. That is, in an active state, an H-level potential of a sub decode signal SDA is applied. In a standby (non-active) state in a normal operation (i.e., non-self refresh mode), the L level potential (=0 volt) of a ground potential GND is applied via the self refresh GND switching circuit 42.

The self refresh GND switching circuit 42 has an inverter 421 and two transistors MOS4 and MOS5 and, further, has a GND line (NMGL) for normal mode connected to the ground potential GND (=0 volt) and a low-voltage circuit bypass line (LVBL) connected to the low voltage generating circuit 43. An input control signal Tself is supplied in common to the inverter 421 and the gate of the transistor MOS5 via an input-side node 422. The input control signal Tself becomes a H level (array potential level) in the self refresh mode and is a L level in the normal operation mode. The input control signal Tself is inverted by the inverter 421, and an output of the inverter 421 is inputted to the gate of the transistor MOS4. Therefore, in the self refresh mode, since the gate of the transistor MOS4 is supplied with the L level signal, the GND line NMGL for the normal mode (ground potential GND=0 volt) is disconnected to the word line WL of the DWL driver circuit 41 by the gate switching control.

On the other hand, in the self refresh mode, the low-voltage circuit bypass line (LVBL) connected to the low-voltage generating circuit 43 side is connected to the word line WL of the DWL driver circuit 41 by setting the gate switching control to be H (i.e., ON) of the transistor MOS5. Consequently, in the standby state in the self refresh mode, the word line WL is switched and fixed so as to be disconnected to the zero-volt ground potential GND side for the normal operation and connected to the low potential (=α volts) side for self refresh mode of the low-voltage generating circuit 43.

As described above, when switched to the self refresh mode, the word line WL is biased to a predetermined low voltage (0+α volts) side in a standby state. The potential difference between the word line WL and the drain (SC) can be therefore decreased and a current leak of the GIDL component can be reduced. That is, the refresh characteristic (retention time of cell data) can be improved, and the cycle of the self timer can be extended. Thus, the current consumption (Icc6) in the self refresh mode can be reduced, and reduction in power consumption of a device can be realized.

[Second Embodiment]

Figure 3:
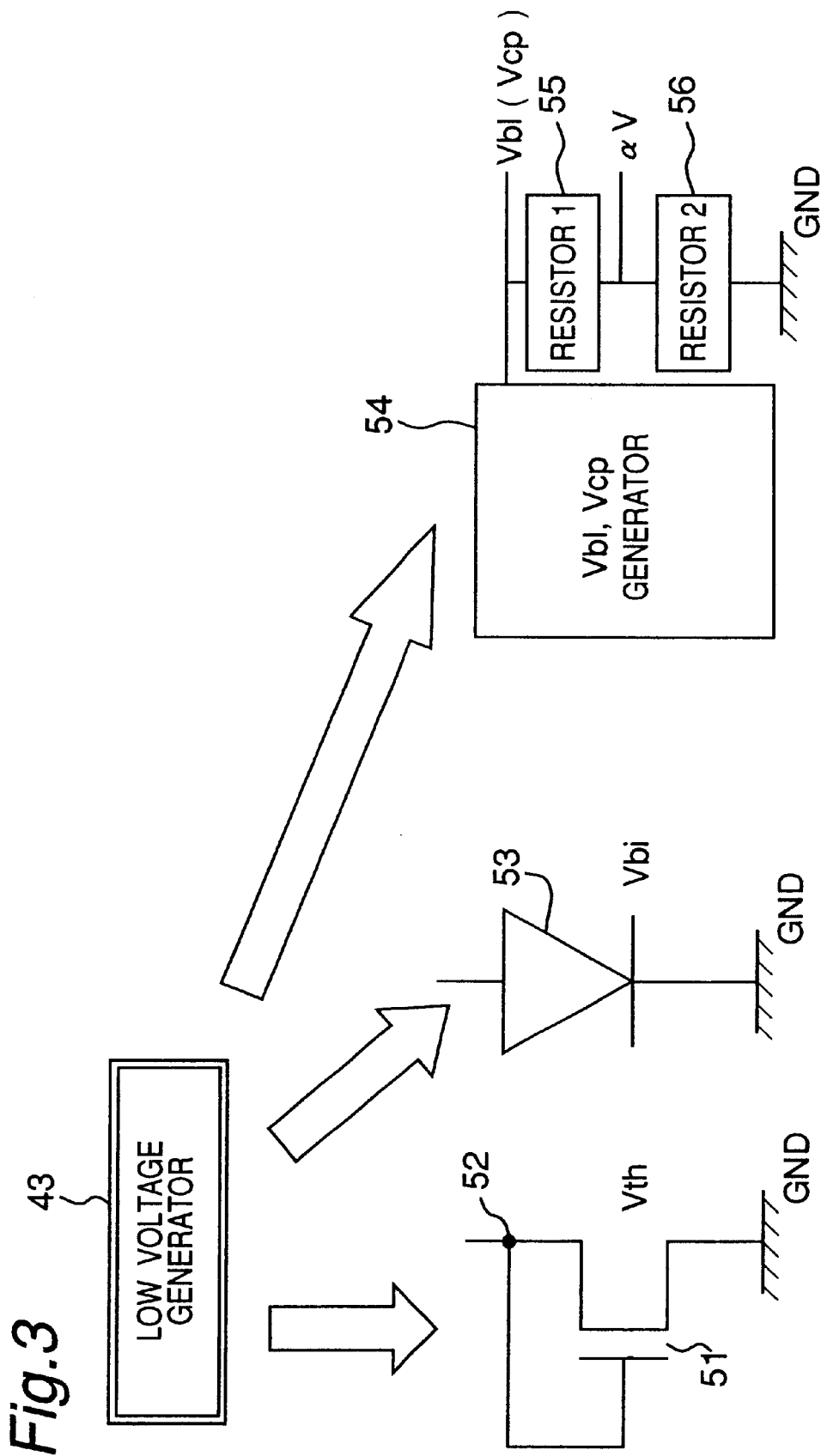
FIG. 3 is a block diagram showing examples of the configuration of a low voltage generating circuit for self refresh according to a second embodiment of the invention.

FIG. 3 shows an example of a configuration of a low-voltage generating circuit used in the WL potential switching mechanism according to the invention. A second embodiment of the invention will be described with reference to FIG. 3. The second embodiment relates to means and method for generating a low voltage (α volts) using the low-voltage generating circuit 43 in the self refresh operation in the first embodiment.

In FIG. 3, there are shown three examples as the low-voltage generating circuit for generating a low potential (GND+a volts) for self refresh. As a first example, an N-channel transistor 51 short-circuiting the gate and drain is used. As a second example of the low-voltage generating circuit 43 for generating a low potential (GND+a volts), a built-in potential Vbi generated by a diode 53 is used. As a third example of the low-voltage generating circuit 43 for generating a low potential (GND+a volts), a low-voltage generating circuit 54 is used for generating a bit line voltage Vb 1 or cell potential Vcp.

In the first example shown in FIG. 3, a threshold potential Vth of the N-channel transistor 51 is used. In this method, the N-channel transistor 51 is of a diode-connected type in which the gate and drain are short-circuited and this N-channel transistor 51 is connected to a node 52 of the low-voltage generating circuit side.

According to this method of the first example, since a large scale low-voltage generating circuit is not necessary for generating the voltage Vb1 or Vcp, it is easy to build the circuit in the DWL driver circuit. There are also advantages such that the structure is simple and the current consumption is not increased by addition of the low-voltage generating circuit. In this case, the low voltage (α) for self refresh corresponds to the threshold potential Vth of the N-channel transistor 51. The low voltage (α) can be adjusted by adjusting the voltage Vth by ion implantation or by using n*Vth (n times as high as Vth) by serially connecting such N-channel transistors.

In the second example, the voltage of built-in potential Vbi of the diode 53 is used. In this configuration, the diode 53 is connected to the node of the low-voltage generating circuit side.

According to this method, since a large scale low-voltage generating circuit is not necessary, the circuit can be easily built in the DWL driver circuit. There are also advantages such that the structure is simple and the current consumption is not increased by addition of the low-voltage generating circuit.

In the third example, the voltage (Vb1 or Vcp) generating circuit 54 is used. Usually, each of the voltages Vb1 and Vcp is ½ of an array voltage. It is also possible to further divide the array voltage using two resistors 55 and 56 to obtain, for example, a ¼* array voltage (derived by dividing the array voltage into four parts).

According to the third example, it is not necessary to add a new low-voltage generating circuit. Moreover, a low potential in a predetermined range is always supplied to the ground potential (0 volt) of the word line WL, so that a stable bias low voltage (0+α volts) can be applied.

[Third Embodiment]

Figure 4:
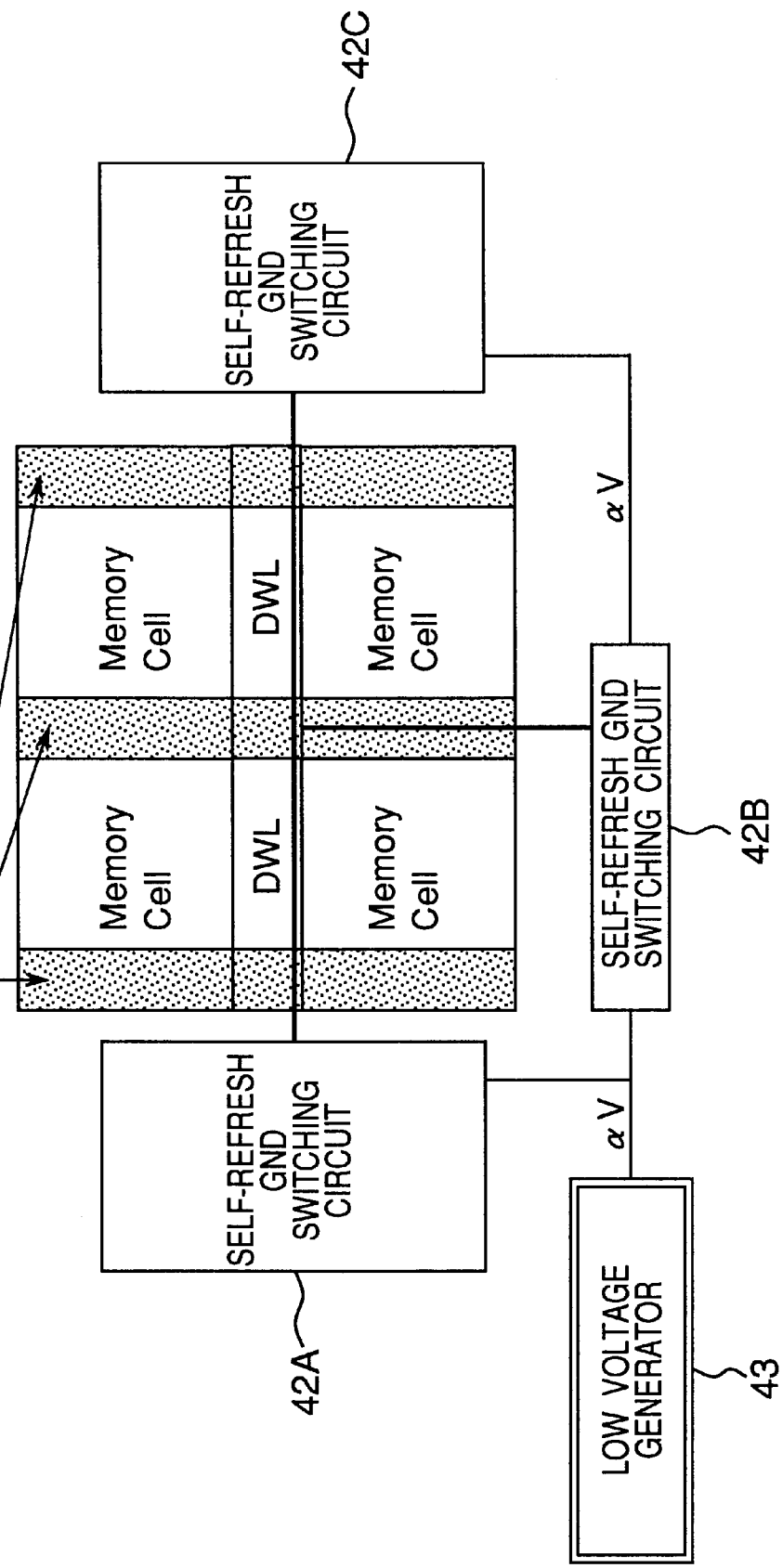
FIG. 4 is a block diagram showing a WL potential switching mechanism according to a third embodiment of the invention.

FIG. 4 is a block diagram showing a WL potential switching mechanism according to a third embodiment of the invention. The third embodiment of the invention will be described by referring to FIG. 4. The components of the DWL driver circuit, self refresh GND switching circuit, and low-voltage generating circuit for self refresh are the same as those in the first embodiment shown in FIG. 2. In the first embodiment shown in FIG. 2, the self refresh GND switching circuit 42 is built in the DWL driver circuit 41. It is therefore inevitable that the size of the DWL driver circuit is larger than the conventional one. The specific feature of the third embodiment resides in the fact that the self refresh GND switching circuit is mounted in the outer peripheral portion of a memory cell array 61.

In the example of the configuration illustrated in FIG. 4, for a plurality of memory cells selectively driven by a sense amplifier (S/A) band and a DWL, a plurality of self refresh GND switching circuits 42A, 42B, and 42C are disposed in the outer peripheral portion of the memory cell array 61, and each self refresh GND switching circuit is interposed between the low-voltage generating circuit 43 and the DWL driver circuit. In FIG. 4, the GND line of each of the self refresh GND switching circuit is not shown since it is similar to that in the first embodiment illustrated in FIG. 2.

With the configuration mentioned above, the DWL driver circuit with the conventional configuration can be used as it is. At the time of building in each of the self refresh GND switching circuits, it is sufficient to consider only routing of the GND line. Thus, the size of the DWL driver circuit can be suppressed.

As described above, according to the present invention, in the self refresh mode, the word line WL is biased to a predetermined low voltage (0+α volts) side in a standby state, thereby enabling the potential difference between the word line WL and the drain (SC) to be decreased and enabling a current leak of the GIDL component to be reduced. Thus, the refresh characteristic (retention time of cell data) can be improved, the cycle of the self timer can be made long, and the current consumption in the self refresh mode can be reduced.

Moreover, with the configuration that the self refresh GND switching circuit is disposed in the outer peripheral portion of the memory cell array, the DWL driver circuit with the conventional configuration can be used as it is. At the time of building in each of the self refresh GND switching circuits, the size of the DWL driver circuit can be suppressed.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A semiconductor integrated circuit having a DRAM mounted thereon, comprising:

a DWL driver circuit for selectively driving a word line, supplying a sub decode signal of an H level as a potential of the word line in an active state, and supplying an L-level signal of a ground potential in a standby state for a normal operation; and bias means for switching and connecting in a self refresh mode the potential of the word line to a potential of a low voltage for self refresh which is slightly higher than said ground potential.

2. A semiconductor integrated circuit having a DRAM mounted thereon, comprising:

a DWL driver circuit for selectively driving a word line, supplying a sub decode signal of an H level as a potential of the word line in an active state, and supplying an L-level signal of a ground potential in a standby state for a normal operation;

a self refresh GND switching circuit interposed between said DWL driver circuit and said ground potential, for switching said ground potential level in a self refresh mode; and a low voltage generating circuit connected to said self refresh GND switching circuit, for generating a low voltage for self refresh which is slightly higher than said ground potential, wherein in the self refresh mode, said self refresh GND switching circuit disconnects said word line from said ground potential and biases the potential of said word line to said low voltage for self refresh generated by said low voltage generating circuit in a standby state.

3. The semiconductor integrated circuit according to claim 1, wherein an upper limit of the low voltage for self refresh is in a range of a level at which an L-level potential of a bit line on a source side does not cause a channel leak to a drain side.

4. The semiconductor integrated circuit according to claim 2, wherein an upper limit of the low voltage for self refresh is in a range of a level at which an L-level potential of a bit line on a source side does not cause a channel leak to a drain side.

5. The semiconductor integrated circuit according to claim 1, wherein said low-voltage generating circuit comprises an N-channel transistor having a gate and a drain short-circuited for generating the low voltage for self refresh.

6. The semiconductor integrated circuit according to claim 2, wherein said low-voltage generating circuit comprises an N-channel transistor having a gate and a drain short-circuited for generating the low voltage for self refresh.

7. The semiconductor integrated circuit according to claim 1, wherein said low-voltage generating circuit comprises a diode for generating a voltage of a built-in potential as the low voltage for self refresh.

8. The semiconductor integrated circuit according to is claim 2, wherein said low-voltage generating circuit comprises a diode for generating a voltage of a built-in potential as the low voltage for self refresh.

9. The semiconductor integrated circuit according to claim 1, wherein said low-voltage generating circuit comprises a voltage generating circuit for generating, as the low voltage for self refresh, a bit line voltage or a cell potential which is a half of an array voltage.

10. The semiconductor integrated circuit according to claim 2, wherein said low-voltage generating circuit comprises a voltage generating circuit for generating, as the low voltage for self refresh, a bit line voltage or a cell potential which is a half of an array voltage.

11. The semiconductor integrated circuit according to claim 1, wherein said self refresh GND switching circuit is provided in an outer periphery of a memory cell array.

12. The semiconductor integrated circuit according to claim 2, wherein said self refresh GND switching circuit is provided in an outer periphery of a memory cell array.

* * * * *